US006556611B1

(12) United States Patent
Khalfin et al.

(10) Patent No.: US 6,556,611 B1
(45) Date of Patent: Apr. 29, 2003

(54) WIDE STRIPE DISTRIBUTED BRAGG REFLECTOR LASERS WITH IMPROVED ANGULAR AND SPECTRAL CHARACTERISTICS

(75) Inventors: Viktor Borisovich Khalfin, Hightstown, NJ (US); Dmitri Zalmanovich Garbuzov, Princeton, NJ (US); Louis Anthony DiMarco, Hamilton Square, NJ (US); John Charles Connolly, Clarksburg, NJ (US)

(73) Assignee: Princeton Lightwave, Inc., Cranbury, NJ (US)

( * ) Notice: Subject to any disclaimer, the term of this patent is extended or adjusted under 35 U.S.C. 154(b) by 0 days.

(21) Appl. No.: 09/468,396

(22) Filed: Dec. 20, 1999

Related U.S. Application Data
(60) Provisional application No. 60/133,393, filed on May 10, 1999.

(51) Int. Cl.[7] ............................ H01S 3/08; H01S 3/098; H01S 3/094

(52) U.S. Cl. ........................ 372/102; 372/19; 372/75; 372/96; 372/99

(58) Field of Search ........................ 372/75, 99, 102, 372/19, 96

(56) References Cited

U.S. PATENT DOCUMENTS

| | | | | |
|---|---|---|---|---|
| 5,231,642 A | * | 7/1993 | Scifres et al. | 372/45 |
| 5,337,328 A | * | 8/1994 | Lang et al. | 372/45 |
| 5,606,573 A | * | 2/1997 | Tsang | 372/96 |

* cited by examiner

Primary Examiner—Paul Ip
Assistant Examiner—James Menefee

(57) ABSTRACT

A diode laser comprises a laser cavity defining a linear optical-path axis, and a current-pumped stripe region, said current-pumped stripe region being disposed within said laser cavity. The laser cavity includes an output surface perpendicular to the optical axis; and a reflection surface including a distributed Bragg reflector (DBR) grating and being disposed at a non-perpendicular angle to the optical-path axis.

7 Claims, 2 Drawing Sheets

WIDE STRIPE DISTRIBUTED BRAGG REFLECTOR LASERS WITH IMPROVED ANGULAR AND SPECTRAL CHARACTERISTICS

RELATED APPLICATIONS

This application claims the benefit of U.S. Provisional application Serial No. 60/133,393, filed May 10, 1999.

FIELD OF THE INVENTION

The present invention relates to semiconductor lasers. In particular, the present invention relates to single-mode, high-power, wide-stripe, diode lasers.

BACKGROUND

Diode lasers typically include a multilayer laser structure that provides an injection of electrons and holes in an active region. Light is generated when the electrons and holes recombine in the active region.

Diodes with a narrow lateral waveguide width (typically 1–5 $\mu$m) can emit a single spatial mode, but are limited in power due to the small volume of the active region necessary for a single-mode laser. Lasers that use an active region of lateral width of 100–200 $\mu$m can operate with optical power higher than the narrow-stripe lasers discussed above. Unfortunately, these lasers tend to generate multimode radiation. In other words, there is in the known arts, typically a trade off between the amount of power generated by a laser and the number of modes emitted by the laser; reducing the number of output modes also reduces the available optical output power.

The available optical power for diode lasers is also limited by the optical losses within the optical cavity. During the last several years, considerable improvement in output powers has been obtained for wide-stripe diode lasers due to the application of a new concept called the broadened wave guide version of separate confinement heterostructure quantum well diode lasers. Analysis of this design shows higher power output and better reliability than in conventional lasers. This is due to reduced internal losses, and to reduced optical power density in both the quantum well active region and laser facets.

The broadened waveguide concept has been successfully applied to the fabrication of different types of diode lasers with wavelengths in the range from 0.8 to 2 $\mu$m. For example, for a 0.97 $\mu$m wavelength Al-free laser with a 100 $\mu$m aperture, continuous wavelength powers of 8–10 W, and quasi-continuous-wavelength powers of 13–14 W, were obtained from devices prepared by both Molecular Beam Epitaxy and Metal Organic Chemical Vapor Deposition. These record output powers directly result from very low internal losses in broadened-waveguide lasers. This, in turn, leads to the opportunity to use devices with cavity length as long as 2–4 mm.

Both conventional wide-stripe lasers and wide-striped broadened-waveguide lasers, however, tend to exhibit lateral and longitudinal multimode behavior at currents well above threshold, and their spectra and lateral far fields become dramatically broadened and unstable. Additionally, these lasers, as well as conventional wide stripes lasers, typically operate with filaments that are self focusing and self sustaining, and this can lead to the laser's degradation.

Thus, a need exists to provide a high-power, single-spatial-mode laser that minimizes these nonlinear effects, and that minimizes their consequential problems.

SUMMARY OF THE INVENTION

To alleviate the problems inherent in high-power semiconductor lasers, and to satisfy the need for a high-power, single-mode laser, one embodiment of the present invention use a wide-stripe, angled distributed-Bragg-reflector laser geometry. For the purposes of the present invention, the term "wide stripe" encompasses stripes that are at least as wide as approximately 20 microns.

In one embodiment of the present invention, a diode laser comprises a semiconductor body having a current-pumped stripe region, an output surface and a reflection surface. The reflection surface can be a distributed Bragg reflector grating disposed in the semiconductor body at a non-parallel angle to the output surface. The output surface and the reflection surface define a laser cavity that substantially contains the current-pumped stripe region.

DETAILED DESCRIPTION

Embodiments of the present invention involve single-mode lasers with wide stripes and relatively high-power emission. In general, an angled distributed Bragg reflector cavity design is used. This design allows suppression of self-focusing effects like filamentation, and decreases the number of modes contributing to laser radiation. In all the embodiments discussed herein, the gratings discussed must satisfy the Bragg conditions at lasing wavelength.

Figure 1:
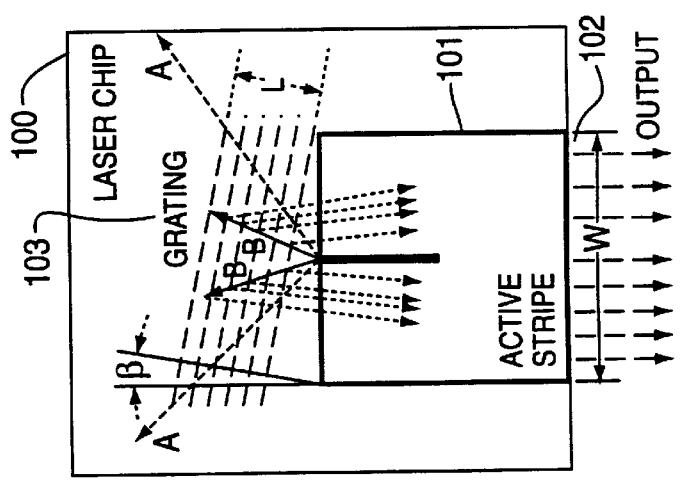
FIG. 1 is a schematic drawing of a cross sectional view of an angled-DBR laser containing an angled grating at the reflection surface.

Turning now in detail to the drawings, FIG. 1 is a schematic drawing of a cross-sectional view of an angled-DBR laser containing a grating reflector angled at very small angle $\beta$ to the longitudinal axis of the cavity. In this figure, laser chip 100 includes active stripe 101. Active stripe 101 is contained within a laser cavity defined by output surface 102 and reflection surface 103, which is shown in this figure as a grating reflector. Reflection surface 103 can be a DBR grating disposed at a non-parallel angle to output surface 102. This non-parallel angle is typically small enough to provide mode selection. In one embodiment of the present invention, the non parallel angle is between approximately 0° and approximately 0.17°.

Active stripe 101 has width W that can be, for example, 100 $\mu$m wide, although embodiments of the present invention are not limited to that width. In one embodiment of the present invention, a stripe region provides gain and lateral mode confinement.

Output surface 102 is partially reflective to allow for lasing within the laser cavity bounded by the reflection surface and the output surface. In one embodiment of the present invention, output surface 102 comprises a cleaved mirror surface with some type of antireflective or low reflective coating.

In contrast to conventional DBR lasers, reflection surface 103 is rotated by an angle β relative to the stripe axis. In other words, reflection surface 103 is placed at an angle β such that the plane defined by the reflection surface (or grating) is not perpendicular to the cavity's longitudinal axis. In one embodiment of the present invention, the angle is chosen so as to provide effective suppression for both non-zero lateral modes and filament radiation, with low additional losses for the zero lateral mode. The spectral half width of the grating reflectivity band in one embodiment is comparable to the longitudinal mode spacing for cavity lengths of 0.5 to 1 mm, therefore providing a single-frequency operation comparable to conventional single mode narrow stripe DBR lasers.

In one embodiment of the present invention, a grating with coupling coefficient $\chi$=(approximately)100 $cm^{-1}$ is prepared by conventional etching/regrowth techniques. If the grating width L in FIG. 1 is approximately 250 $\mu$m, the product $\chi L$ is high enough to provide a grating reflectivity as high as 97% under Bragg conditions. In one embodiment of the present invention, grating angle β is between 0° and 0.17°.

Figure 2:
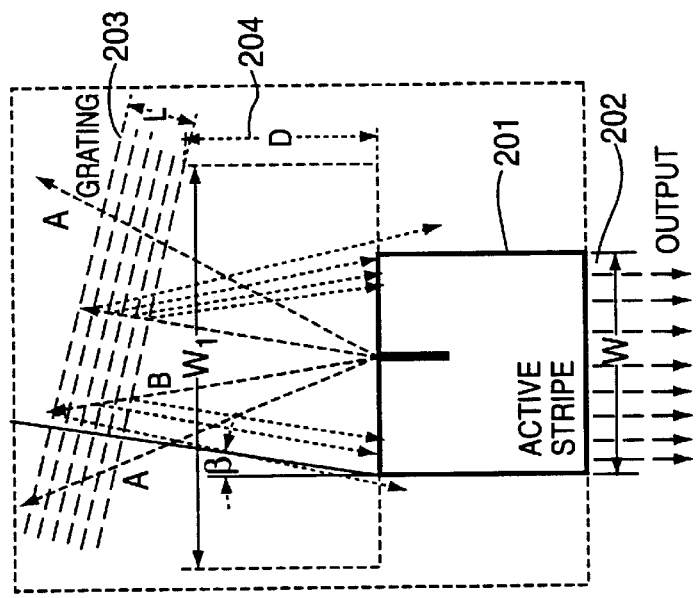
FIG. 2 is a schematic drawing of a cross sectional view of an angled-DBR laser containing an angled grating at the reflection surface, and separated from the active region by some distance D.

FIG. 2 is a schematic drawing of a cross sectional view of an alpha-DBR laser containing angled grating 203 at the reflection surface, and separated from active region 201 by a spacer region 204 at distance D from active stripe 201. Spacer region 204 has length D, and is incorporated between active stripe 201 and DBR grating 203. In one embodiment of the present invention, spacer region 204 can be current pumped. In another embodiment of the present invention, spacer region 204 can be unpumped. If spacer region 204 is pumped, it can be considered as an expanded portion of the main active stripe.

In one embodiment of the present invention, the width $W_1$ of the pumped spacer region is greater than $3*\lambda*D/W$, where W is the stripe width. This dimension is chosen because it can facilitate free diffraction of radiation in the spacer region. The length of the pumped spacer D should be three times larger than W, the width of the stripe. The same condition for the length of the stripe is valid for the unpumped spacer region as well.

In one embodiment, if spacer region 204 is unpumped, then the absorption coefficient for the laser radiation is less than approximately 30 $cm^{-1}$. If the absorption of laser radiation is high enough (e.g., greater than approximately 30 $cm^{-1}$) to create important additional losses, the spacer region is preferably current-pumped. The electrical contact to the spacer region is preferably electrically separated from the contact to the main stripe. The current density in the spacer region is preferably less than the current density in the main stripe portion. This can have the added benefit of decreasing the absorption of laser radiation in the spacer to less than approximately 30 $cm^{-1}$.

The spacer region, whether pumped or unpumped, can help suppress both filament formation and radiation in non-zero lateral modes. Therefore, the embodiment with the spacer is very attractive for additional suppression of filamentation in wide stripe laser diodes.

Figure 3:
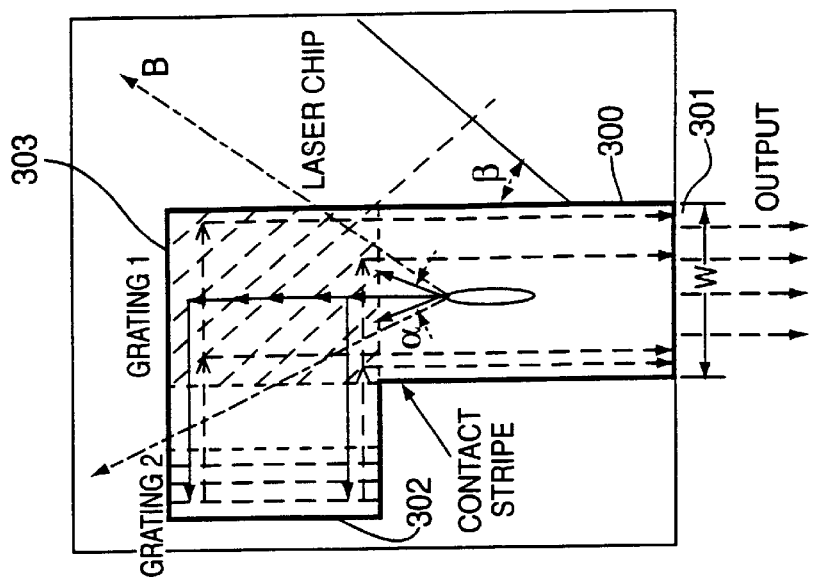
FIG. 3 is a schematic drawing of a cross sectional view of an angled-DBR laser with two grating reflectors in which the grating reflectors do not need to be perpendicular to the output surface.
Figure 4:
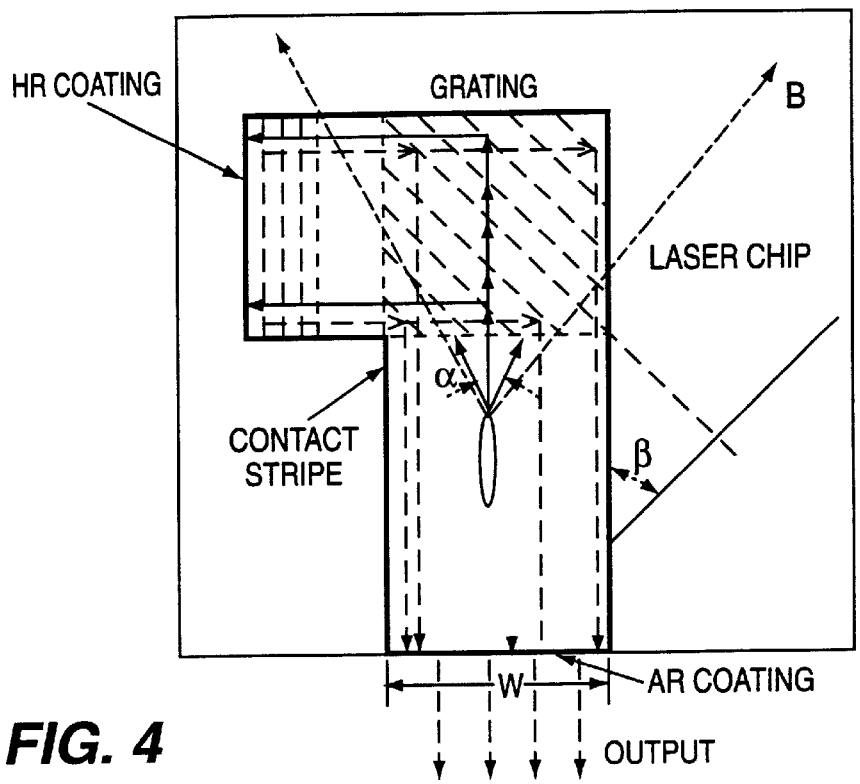
FIG. 4 is a schematic drawing of a cross sectional view of an angled-DBR laser with a grating reflector to turn the beam by 90 degrees in the cavity, but with no grating at the reflection surface which is perpendicular to the output surface.

FIGS. 3 and 4 are schematic drawings of a cross-sectional view of an angled-DBR laser on a semiconductor body with two DBR grating reflectors, with one of the grating reflectors being perpendicular to the output surface. As can be seen from FIG. 3, this embodiment of the invention contains active region 300 that is substantially "L" shaped. The diode laser is contained on a semiconductor body that includes current-pumped stripe region 300, output surface 301, reflection surface 302, and angled DBR grating 303. Output surface 301 and reflection surface 302 define a laser cavity that contains active stripe region 300.

Between output surface 301 and reflection surface 302 lies DBR grating 303 that is angled relative to the cavity's local longitudinal axis. For the purposes of the present invention, the local longitudinal axes are defined first as the axis of symmetry that lies perpendicular to the output surface (on the output-surface side of angled grating 303), and second as the axis of symmetry that lies perpendicular to the reflection surface (on the reflection surface side of angled grating 303).

It should be appreciated that the plane of output surface 301 does not have to be perpendicular to reflection surface 302. In one embodiment, grating 303 is rotated by an angle β relative to the local axis, as is shown in FIG. 3. For example, the angle β may be in the range of approximately 15 degrees to approximately 75°. The particular case of the β=45° is shown in the FIG. 3.

In one embodiment of the present invention, the grating period of grating 303 is a factor 1/cos(β) longer than that of grating 302, and both grating periods should satisfy the Bragg conditions at lasing wavelength.

In FIG. 4, reflection surface 402 is a high-reflective cleaved surface with its plane perpendicular to the plane of output surface 401. In one embodiment, the angle β should be 45°.

The angled grating in FIGS. 3 and 4 (e.g., angled grating 303) can suppress filamentation as is illustrated on the FIGS. 3 and 4. In one embodiment of the present invention, the penetration depth for the beam into the grating, $S_p$, is larger than the strip width. This configuration can redistribute the beam which was generated by the filament over the width of the stripe, thereby suppressing filamentation. For radiation that satisfies the Bragg condition, $S_p$ approximately equals the inverse grating coupling coefficient $\chi$. To achieve a more uniform intensity redistribution over the entire stripe width, the grating coupling coefficient $\chi$ should be close to $W^{-1}$, where W is the stripe width. The conventional stripe width for high-power lasers is from approximately 100 to 200 $\mu$m.

FIG. 4 is a schematic drawing of a cross sectional view of an angled-DBR laser with a grating reflector to turn the beam by, for example, 90 degrees in the cavity, but with no grating at the reflection surface. This embodiment is similar to the embodiment displayed in FIG. 3 except that the reflection surface does not use a reflection grating. It should be appreciated that, while the embodiment in FIG. 4 illustrates a high reflection (HR) coating on the reflection surface, this HR coating is optional.

Figure 5:
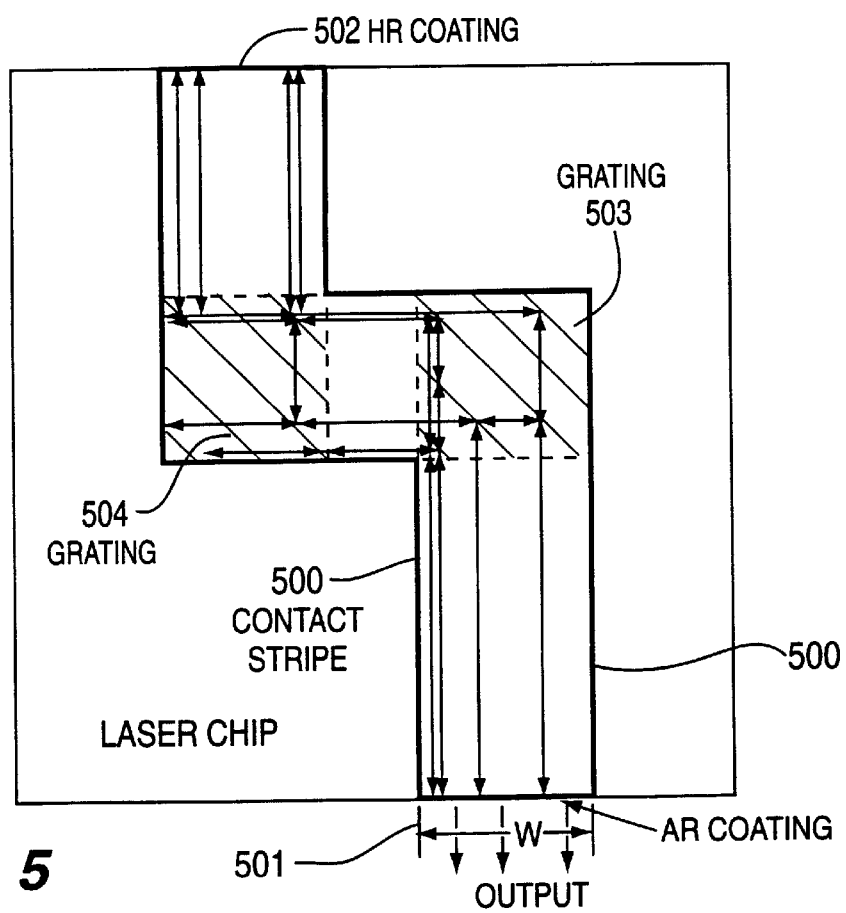
FIG. 5 is a schematic drawing of a cross sectional view of an angled-DBR laser containing two reflection gratings to turn the beam by 90 degrees each, and where the reflection surface is parallel to the output surface.

FIG. 5 is a schematic drawing of a cross sectional view of an angled-DBR laser containing two reflection gratings to turn the beam by, in one embodiment, approximately 90 degrees each, and where the reflection surface is parallel to the output surface. This embodiment is similar to the embodiments shown in FIGS. 3 and 4. The laser is positioned on a semiconductor body that has output surface 501 and reflection surface 502 substantially parallel to output surface 501. Output surface 501 and reflection surface 502 define a laser cavity.

Within the laser cavity lies first DBR grating 503 and second DBR grating 504. These two grating reflectors act to bend the fundamental mode at a substantially-right angle so that reflection surface 502 and output surface 501 can lie substantially parallel to each other as in the figure. This embodiment allows for advantages similar to the embodiments in FIGS. 3 and 4, but is easier to fabricate because reflection surface 502 and output surface 501 are parallel to each other.

The present invention has been described in terms of several embodiments solely for the purpose of illustration. Persons skilled in the art will recognize from this description that the invention is not limited to the embodiments described, but may be practiced with modifications and alterations limited only by the spirit and scope of the appended claims. For example, different dimensions can be chosen within the specified constraints, different grating angles can be chosen, etc.

What is claimed is:

1. A diode laser comprising:
   (1) an output surface;
   (2) a reflection surface substantially parallel to, and offset from, said output surface, the output surface and reflection surface defining a laser cavity;
   (3) a first DBR grating with the laser cavity, and disposed 45 degrees to the local longitudinal axis of the laser cavity; and
   (4) a second DBR grating within the laser cavity, and disposed at 45 degrees to the laser cavity.

2. The diode laser of claim 1, wherein the grating period of the first DBR grating is different from the grating period of the second DBR grating.

3. The diode laser of claim 1, further comprising a current-pumped stripe region.

4. The diode laser of claim 3, wherein the first DBR grating abuts at least a portion of the current-pumped stripe region.

5. The diode laser of claim 3, wherein the first DBR grating is separated from the end of the current-pumped stripe region by a spacer region.

6. The diode laser of claim 5, wherein the spacer region is current-pumped.

7. The diode laser of claim 5, wherein the current-pumped striped region has a predetermined width, wherein the spacer region has a predetermined length, and wherein the length of the spacer region is about three times the width of the current-pumped stripe region.

* * * * *